United States Patent
Shindo (10) Patent No.: US 12,322,642 B2
(45) Date of Patent: Jun. 3, 2025

(54) SUBSTRATE TRANSFER DEVICE AND SUBSTRATE TRANSFER METHOD

(71) Applicant: Tokyo Electron Limited, Tokyo (JP)

(72) Inventor: Takehiro Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 17/659,019

(22) Filed: Apr. 13, 2022

(65) Prior Publication Data

US 2022/0336260 A1  Oct. 20, 2022

(30) Foreign Application Priority Data

Apr. 19, 2021  (JP) ................................ 2021-070620

(51) Int. Cl.
| | |
|---|---|
| H01L 21/687 | (2006.01) |
| B65G 43/08 | (2006.01) |
| B65G 54/02 | (2006.01) |
| G05D 1/00 | (2006.01) |
| H01F 7/02 | (2006.01) |

(52) U.S. Cl.
CPC ........ H01L 21/68764 (2013.01); B65G 43/08 (2013.01); B65G 54/02 (2013.01); G05D 1/0221 (2013.01); H01F 7/0236 (2013.01); *B65G 2203/0283* (2013.01)

(58) Field of Classification Search
CPC ......... H01L 21/68764; H01L 21/67196; H01L 21/67742; H01L 21/67709; H01L 21/67265; H01L 21/67259; H01L 21/68; B65G 43/08; B65G 54/02; B65G 2203/0283; G05D 1/0221; H01F 7/0236;

(Continued)

(56) References Cited

U.S. PATENT DOCUMENTS 4,692,115 A * 9/1987 Aldridge ........... H01L 21/67754
414/940
4,721,424 A * 1/1988 Aldridge ........... H01L 21/67126
403/353

(Continued)

FOREIGN PATENT DOCUMENTS

| CN | 112236851 A | 1/2021 |
|---|---|---|
| JP | 2004-518204 A | 6/2004 |

(Continued)

*Primary Examiner* — Shawki S Ismail
*Assistant Examiner* — Lisa N Homza
(74) *Attorney, Agent, or Firm* — Armstrong Teasdale LLP (57) ABSTRACT

A substrate transfer device is provided with: a movement tile provided in a substrate transfer region and including first magnets for changing a state of a magnetic field and a movement surface; a substrate transfer module including a second magnet that receives a magnetic force and configured to move along the movement surface while being floated from the movement surface by the magnetic force; a transfer controller for controlling the magnetic field formed by the first magnets to move the substrate transfer module along a preset route; a detector for detecting an index value corresponding to a magnitude of a deviation, from the preset route, of an actual movement path of the substrate transfer module moving along the movement surface; and a correction parameter calculation part for calculating a correction parameter for correcting the magnetic force acting on the second magnet based on the index value.

12 Claims, 8 Drawing Sheets

(58) Field of Classification Search
CPC ... H01F 7/0247; H01F 7/206; H01F 2007/208
USPC .......................................................... 335/285
See application file for complete search history.

(56) References Cited

U.S. PATENT DOCUMENTS

| | | | | |
|---|---|---|---|---|
| 4,755,746 | A * | 7/1988 | Mallory | G01R 31/2831 324/719 |
| 5,483,138 | A * | 1/1996 | Shmookler | H01L 21/681 318/568.16 |
| 5,529,703 | A * | 6/1996 | Sprenger | B03C 1/253 219/653 |
| 5,645,391 | A * | 7/1997 | Ohsawa | H01L 21/67778 414/416.03 |
| 5,647,477 | A * | 7/1997 | Morishita | B65G 54/02 104/282 |
| 6,228,773 | B1 * | 5/2001 | Cox | H01L 21/6719 118/719 |
| 10,242,665 | B1 * | 3/2019 | Abeloe | B60W 30/0956 |
| 10,620,631 | B1 * | 4/2020 | Abeloe | B60W 30/0956 |
| 10,802,489 | B1 * | 10/2020 | Abeloe | B60R 11/04 |
| 2006/0169208 | A1 * | 8/2006 | Shinozaki | H01L 21/67017 118/715 |
| 2008/0232937 | A1 * | 9/2008 | Abe | H01L 21/67766 414/222.02 |
| 2009/0053021 | A1 * | 2/2009 | Yamagishi | H01L 21/681 414/806 |
| 2009/0269933 | A1 * | 10/2009 | Yamaguchi | C23C 16/458 438/758 |
| 2010/0124610 | A1 * | 5/2010 | Aikawa | C23C 16/4584 118/712 |
| 2010/0150687 | A1 * | 6/2010 | Sakata | H01L 21/68707 414/222.07 |
| 2010/0227046 | A1 * | 9/2010 | Kato | H01L 21/67253 118/712 |
| 2010/0280653 | A1 * | 11/2010 | Aburatani | H01L 21/68707 700/228 |
| 2013/0017628 | A1 * | 1/2013 | Kosugi | G01K 13/02 374/E7.004 |
| 2015/0179395 | A1 * | 6/2015 | Yamamoto | H01L 21/67213 250/453.11 |
| 2015/0250137 | A1 * | 9/2015 | Palsgaard | A01K 5/0266 119/57.92 |
| 2016/0194158 | A1 * | 7/2016 | Senn | B65G 43/00 198/794 |
| 2016/0207717 | A1 * | 7/2016 | Senn | B65G 54/02 |
| 2016/0218029 | A1 * | 7/2016 | Janakiraman | H01L 21/67709 |
| 2018/0166310 | A1 * | 6/2018 | Onzuka | H01L 21/67754 |
| 2019/0047794 | A1 * | 2/2019 | Ozimek | B65G 43/10 |
| 2019/0067055 | A1 * | 2/2019 | Zheng | H01L 21/67754 |
| 2020/0004166 | A1 * | 1/2020 | Aoki | G03F 7/70758 |
| 2020/0006100 | A1 * | 1/2020 | Clark | H01L 21/68707 |
| 2020/0017308 | A1 * | 1/2020 | Huang | B65G 54/02 |
| 2020/0211867 | A1 * | 7/2020 | Maezono | B08B 3/08 |
| 2020/0241564 | A1 * | 7/2020 | Goldman | G05D 1/0297 |
| 2020/0301743 | A1 * | 9/2020 | Moustafa | G06F 9/5044 |
| 2021/0192748 | A1 * | 6/2021 | Morales Morales | G06V 10/82 |
| 2021/0284462 | A1 * | 9/2021 | Royce | B60L 13/03 |
| 2021/0335648 | A1 * | 10/2021 | Wei | B25J 15/0004 |
| 2022/0135347 | A1 * | 5/2022 | Cohen | B25J 9/1687 700/245 |
| 2022/0301921 | A1 * | 9/2022 | Shindo | H01L 21/67748 |
| 2022/0308458 | A1 * | 9/2022 | Liang | G03F 7/70975 |
| 2022/0340370 | A1 * | 10/2022 | Kono | H01L 21/67276 |
| 2023/0163013 | A1 * | 5/2023 | Sreenivasan | H01L 24/83 156/345.51 |
| 2024/0128103 | A1 * | 4/2024 | Deng | H01L 21/67742 |

FOREIGN PATENT DOCUMENTS

| | | |
|---|---|---|
| JP | 2018504784 A | 2/2018 |
| KR | 10-2017-0106464 A | 9/2017 |

* cited by examiner

SUBSTRATE TRANSFER DEVICE AND SUBSTRATE TRANSFER METHOD

CROSS-REFERENCE TO RELATED APPLICATION

This application is based upon and claims the benefit of priority from Japanese Patent Application No. 2021-070620, filed on Apr. 19, 2021, the entire contents of which are incorporated herein by reference.

TECHNICAL FIELD

The present disclosure relates to a substrate transfer device and a substrate transfer method.

BACKGROUND

For example, in an apparatus that performs processing on a semiconductor wafer (hereinafter also referred to as "wafer") as a substrate, the wafer is transferred between a carrier which accommodates the wafer and a wafer processing chamber in which processing is executed. Wafer transfer mechanisms having various configurations are used to transfer wafers.

For example, Patent Document 1 discloses a substrate transfer system in which a coplanar surface is formed by a first planar motor and a second planar motor provided on a first vertically-movable lift and a substrate carrier is caused to float and move between these planar motors. The substrate transfer system is configured to smoothly move the substrate carrier between the first and second planar motors by adjusting the arrangement of a plurality of coils provided in the first and second planar motors.

PRIOR ART DOCUMENT

Patent Document

Patent Document 1: International Application Japanese Translation Publication No. 2018-504784

SUMMARY

According to one embodiment of the present disclosure, a device for transferring a substrate with respect to a substrate processing chamber in which a substrate processing is performed, includes: a movement tile provided in a substrate transfer region extending from a substrate delivery position communicating with an outside to a substrate processing position inside the substrate processing chamber, the movement tile including a plurality of first magnets configured to change a state of a magnetic field and a movement surface; a substrate transfer module configured to hold the substrate and including a second magnet configured to receive an action of a magnetic force which is at least one of a repulsive force and an attractive force acting between the magnetic field of the plurality of first magnets and a magnetic field of the second magnet, the substrate transfer module configured to move along the movement surface in a state of being floated from the movement surface by the magnetic force; a transfer controller configured to control the magnetic field formed by the plurality of first magnets so that the substrate transfer module is moved along a preset route; a detector configured to detect an index value corresponding to a magnitude of a deviation, from the preset route, of an actual movement path of the substrate transfer module moving along the movement surface as the magnetic field is controlled by the transfer controller; and a correction parameter calculation part configured to calculate a correction parameter for correcting the magnetic force acting on the second magnet based on the index value so that the magnitude of the deviation is reduced, wherein the transfer controller is configured to perform a correction to change the state of the magnetic field based on the correction parameter in a subsequent transfer of the substrate along the preset route.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an overall configuration of a wafer processing system 100 including a "substrate transfer device" according to an embodiment of the present disclosure will be described with reference to FIG. 1.

Figure 1:
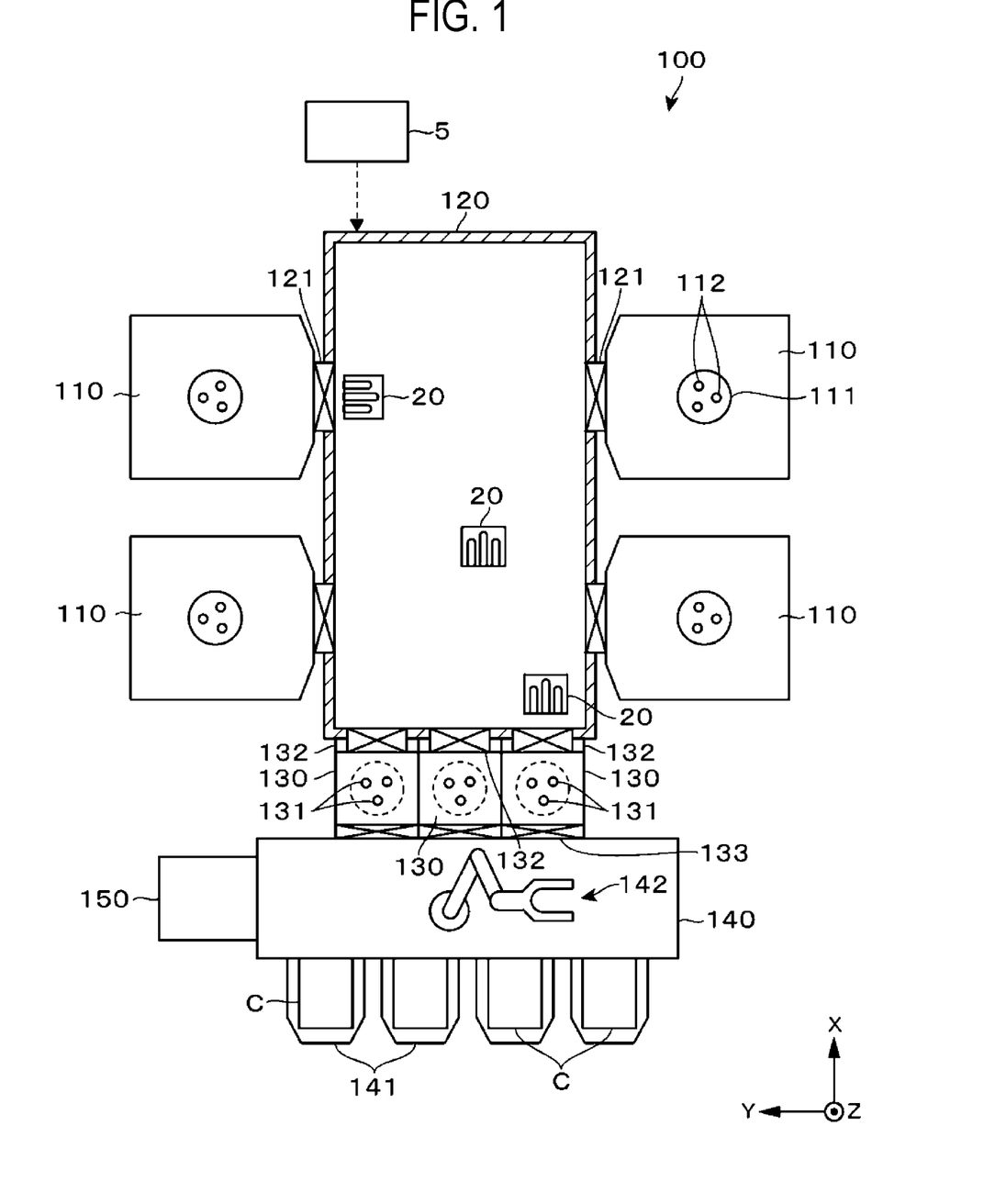
FIG. 1 is a plan view of a wafer processing system according to an embodiment.

FIG. 1 shows the wafer processing system 100 of a multi-chamber type including a plurality of wafer processing chambers 110. The wafer processing chambers 110 correspond to substrate processing chambers for processing wafers W.

As shown in FIG. 1, the wafer processing system 100 includes load ports 141, an air transfer chamber 140, load lock chambers 130, a vacuum transfer chamber 120, and a plurality of wafer processing chambers 110. In the following description, a side on which the load ports 141 are provided will be referred to as a front side of the wafer processing system 100.

In the wafer processing system 100, the load ports 141, the air transfer chamber 140, the load lock chambers 130, and the vacuum transfer chamber 120 are arranged in the named order from the front side in the horizontal direction. Further, the wafer processing chambers 110 are provided side by side on the left and right sides of the vacuum transfer chamber 120 when viewed from the front side.

The load ports 141 are configured as stages on which carriers C for accommodating wafers W to be processed are placed. Four load ports 141 are installed side by side in the left-right direction when viewed from the front side. As the carriers C, for example, FOUPs (Front Opening Unified Pods) or the like may be used.

The air transfer chamber 140 is kept in an atmospheric pressure (normal pressure) atmosphere. For example, a downflow of clean air is formed inside the air transfer chamber 140. Further, a wafer transfer mechanism 142 for transferring the wafer W is provided inside the air transfer chamber 140. The wafer transfer mechanism 142 transfers the wafer W between the carrier C and the load lock chamber 130. Further, for example, on the left side surface of the air transfer chamber 140, an alignment chamber 150 for aligning the wafer W is provided.

The load lock chambers 130 are installed side by side between the vacuum transfer chamber 120 and the air transfer chamber 140. The load lock chamber 130 includes elevating pins 131 that push up the loaded wafer W from below and hold the loaded wafer W. In this example, three elevating pins 131 are installed at equal intervals in the circumferential direction and are configured to be movable up and down. The load lock chamber 130 is configured to be switchable between an atmospheric pressure atmosphere and a vacuum atmosphere.

The load lock chamber 130 and the air transfer chamber 140 are connected to each other via a gate valve 133. Further, the load lock chamber 130 and the vacuum transfer chamber 120 are connected to each other via a gate valve 132.

The vacuum transfer chamber 120 is depressurized to a vacuum atmosphere by a vacuum exhaust mechanism (not shown). In the example shown in FIG. 1, the vacuum transfer chamber 120 in which the wafer W is transferred in a vacuum atmosphere is composed of a housing elongated in the front-rear direction and having a rectangular plan-view shape. In the wafer processing system 100 of this example, four wafer processing chambers 110 are provided on the left and right sidewalls of the vacuum transfer chamber 120, two for each side wall. When the interior of the vacuum transfer chamber 120 shown in FIG. 1 is divided into two front and rear regions as viewed from the front side, the wafer processing chambers 110 are installed so as to face each other while sandwiching each region from the left and right sides.

Openings for loading and unloading the wafer W between the wafer processing chambers 110 are formed in the sidewalls of the vacuum transfer chamber 120 to which the respective wafer processing chambers 110 are connected. Gate valves 121 that can be opened and closed are provided in the openings.

Each wafer processing chamber 110 is connected to the vacuum transfer chamber 120 via the gate valve 121. In each wafer processing chamber 110, a wafer W is placed on a stage 111 provided inside the wafer processing chamber 110 in a state in which the wafer processing chamber 110 is depressurized to a vacuum atmosphere by a vacuum exhaust mechanism (not shown), and a predetermined process is performed on the wafer W. The placement area of the wafer W on the stage 111 corresponds to the processing position of the wafer W. The wafer processing chamber 110 includes elevating pins 112 that push up the loaded wafer W from below and hold the loaded wafer W. In this example, three elevating pins 112 are installed at equal intervals in the circumferential direction and are configured to be movable up and down.

Examples of the process to be performed on the wafer W include an etching process, a film-forming process, a cleaning process, an ashing process, and the like.

The stage 111 is provided with, for example, a heater (not shown) that heats the wafer W to a preset temperature. When the process performed on the wafer W uses a processing gas, the wafer processing chamber 110 is provided with a processing gas supplier (not shown) composed with a shower head or the like. Further, the wafer processing chamber 110 may be provided with a plasma forming mechanism for plasmarizing the processing gas.

A plurality of transfer modules 20 configured in a square plate shape is accommodated in the vacuum transfer chamber 120. Each of the transfer modules 20 is configured to be movable in the vacuum transfer chamber 120 by magnetic floating. The transfer module 20 corresponds to a substrate transfer module of the present embodiment. In the wafer processing system 100 of this example, the wafer W is transferred between the load lock chamber 130 and each wafer processing chamber 110 by using the transfer module 20.

The wafer processing system 100 includes a controller 5. The controller 5 is constituted with a computer including a CPU and a memory and is configured to control each part of the wafer processing system 100. The memory stores a program incorporating a group of steps (instructions) for controlling the operations of the transfer module 20 and the wafer processing chamber 110. This program is stored on a storage medium such as a hard disk, a compact disk, a magnetic optical disk, a memory card, or the like, and is installed in the computer from the storage medium.

Hereinafter, a configuration of equipment related to the transfer of the wafer W using the transfer modules 20 will be described with reference to FIGS. 2 and 3.

The transfer module 20 includes a stage 2 as a substrate holder on which the wafer W having a diameter of 300 mm is placed and held. For example, the stage 2 is formed in the shape of a flat square plate having a side of about 300 mm.

The transfer module 20 enters the wafer processing chamber 110 and the load lock chamber 130 to transfer the wafer W to and from the elevating pins 112 and 131. The transfer module 20 is formed with slits 21 for enabling the transfer of the wafer W while avoiding interference with the elevating pins 112 and 131. The elevating pins 112 and 131 hold the wafer W in a state of protruding from the floor surface of the wafer processing chamber 110 and the load lock chamber 130. The slits 21 are formed along a trajectory through which the elevating pins 112 and 131 pass when the stage 2 is caused to move toward and away from a position below the wafer W held by the elevating pins 112 and 131. Further, the slits 21 are formed so that the approach direction to the position below the wafer W can be reversed by 180 degrees. With the above-described configuration, the transfer module 20 can be arranged so as to be vertically aligned with the center of the wafer W without interference between the transfer module 20 and the elevating pins 112 and 131.

Figure 3:
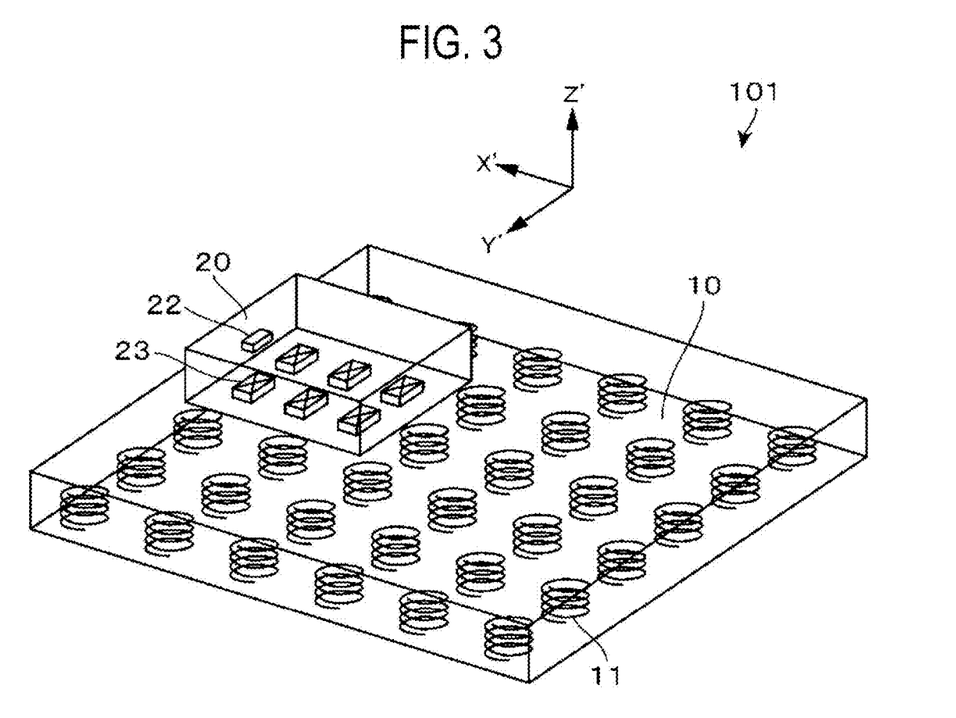
FIG. 3 is a transparent perspective view of a transfer module and a tile.

As schematically shown in FIG. 3, a plurality of tiles (movement tiles) 10 is provided on the floor surface side of the load lock chamber 130, the vacuum transfer chamber 120, and the wafer processing chamber 110. The tiles 10 are provided in a wafer transfer region extending from a wafer delivery position (an arrangement position of the elevating pins 131) with respect to the external air transfer chamber 140 to a wafer processing position in the wafer processing chamber 110.

A plurality of movement-surface-side coils 11 is arranged inside the tile 10. Each of the movement-surface-side coils 11 generates a magnetic field by being supplied with electric power from a power supply 53 which will be described later. Each of the movement-surface-side coils 11 corresponds to a first magnet of the present embodiment.

On the other hand, inside the transfer module 20, for example, a plurality of module-side magnets 23 constituted with permanent magnets is arranged. A repulsive force (magnetic force) acts between the module-side magnet 23 and the magnetic field generated by the movement-surface-side coil 11. By this action, the transfer module 20 can be magnetically floated with respect to the movement surface on the upper surface side of the tile 10. Further, the tile 10 can cause the movement-surface-side coils 11 to adjust the position and magnitude of the generated magnetic force and to change the state of the magnetic field. By controlling the magnetic field in this way, it is possible to move the transfer module 20 in a desired direction on the movement surface, adjust the floating distance from the movement surface, and adjust the orientation of the transfer module 20.

Each of the module-side magnets 23 provided on the transfer module 20 corresponds to a second magnet of the present embodiment. Each of the module-side magnets 23 may be configured by a coil that receives electric power from a battery provided in the transfer module 20 and functions as an electromagnet or may be configured by providing both a permanent magnet and a coil.

In the wafer processing system 100 of this example, the tile 10 schematically shown in FIG. 3 and the transfer module 20 constitute a device for transferring the wafer W (wafer transfer device 101).

Figure 4:
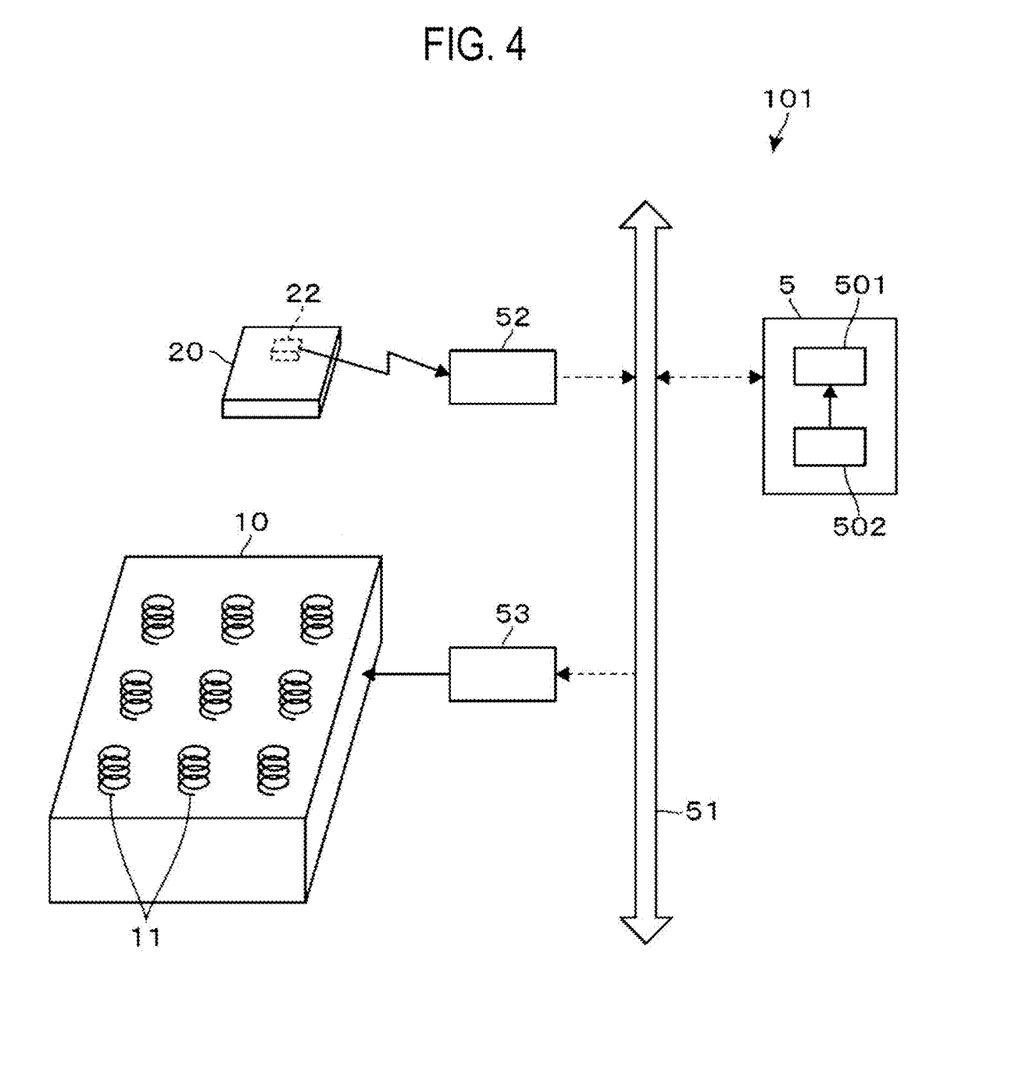
FIG. 4 is a block diagram showing a correction mechanism for correcting a movement route of the transfer module.

FIG. 4 is a block diagram showing an electrical configuration of the wafer transfer device 101. DC power is supplied from the power supply 53 to each movement-surface-side coil 11 provided in the tile 10. The power supply 53 is connected via a bus 51 to the above-described controller 5 that controls the entire wafer processing system 100. The controller 5 executes a function as a transfer controller 501 that controls the operation of the transfer module 20 by controlling the magnetic field formed by the movement-surface-side coil 11 provided in the tile 10.

The control of the magnetic field of the movement-surface-side coil 11 is performed by using, as operation variables, selection of the movement-surface-side coil 11 to be supplied with electric power, the amount of electric power supplied to the selected movement-surface-side coil 11, switching of the power supply direction (switching of magnetic poles), and the like. Then, by adjusting the operation variables, the transfer module 20 can be moved along a preset route.

The controller 5 functions as a transfer controller 501 that controls the magnetic field formed by the movement-surface-side coil 11 so as to move the transfer module 20 along the preset set route in the wafer transfer device 101.

For example, when the carrier C is placed on the load port 141, a processing recipe that defines the processing content set for each of the plurality of wafers W accommodated in the carrier C is read out.

Based on this processing recipe, the transfer controller 501 specifies the wafer processing chamber 110 capable of executing the processing specified in the processing recipe and creates a transfer schedule for the plurality of wafers W. The transfer schedule includes, for example, information for specifying the load lock chamber 130 to be used when the wafer W taken out from the carrier C is carried into and out of the vacuum transfer chamber 120, and the wafer processing chamber 110 for processing the wafer W. Further, the transfer schedule includes information that specifies the transfer module 20 to be used when transferring the wafer W in the vacuum transfer chamber 120, and information that specifies a route (preset route) through which the transfer module 20 passes when transferring the wafer W between the load lock chamber 130 and the wafer processing chamber 110.

The transfer controller 501 controls the supply of electric power to each movement-surface-side coil 11 provided in the tile 10 based on the above-mentioned transfer schedule. As a result, the magnetic field formed by the movement-surface-side coil 11 is adjusted. Then, by changing the magnetic force applied to the module-side magnet 23 of the transfer module 20, the transfer module 20 can be moved along a preset route.

In the wafer transfer device 101 having the above configuration, if the transfer controller 501 can control the power supply to each movement-surface-side coil 11 and can apply the magnetic force to the transfer module 20 in a designed manner, it is possible to move the transfer module 20 accurately along the preset route. Meanwhile, the arrangement positions of the movement-surface-side coil 11 in the tile 10, the module-side magnet 23 in the transfer module 20 and a detector (e.g., a hall sensor) for detecting a position of the transfer module 20 may be deviated from designed positions within a range of tolerance. This also applies to the arrangement positions of many tiles 10 arranged on the floor surfaces of the load lock chamber 130, the vacuum transfer chamber 120 and the wafer processing chamber 110. In addition, the characteristics such as the degree of uniformity of winding of each movement-surface-side coil 11, the magnetic force of the module-side magnet 23, and the like may also vary for each individual device.

Figure 5:
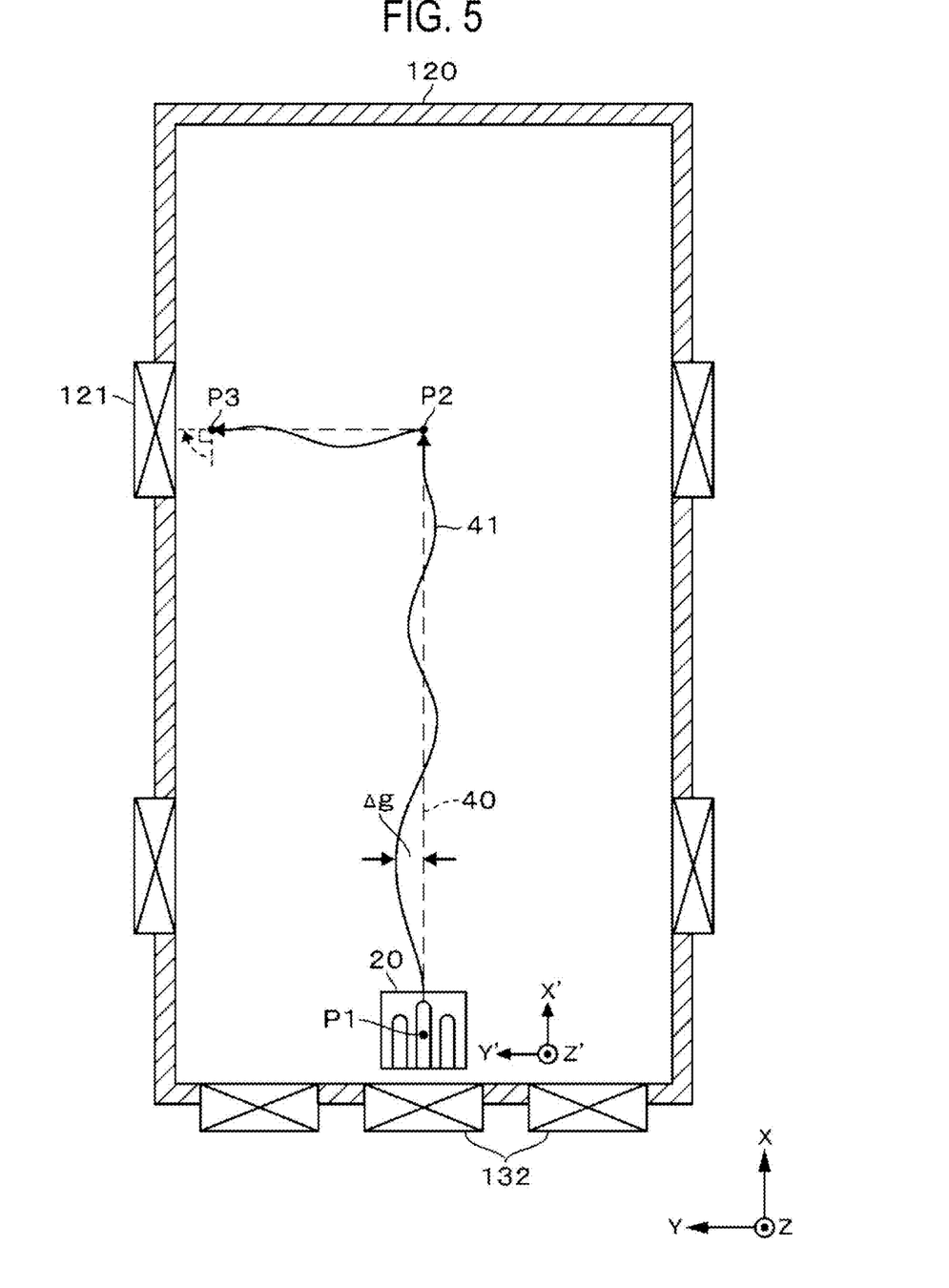
FIG. 5 is a plan view showing an example of the movement route of the transfer module.
Figure 6:
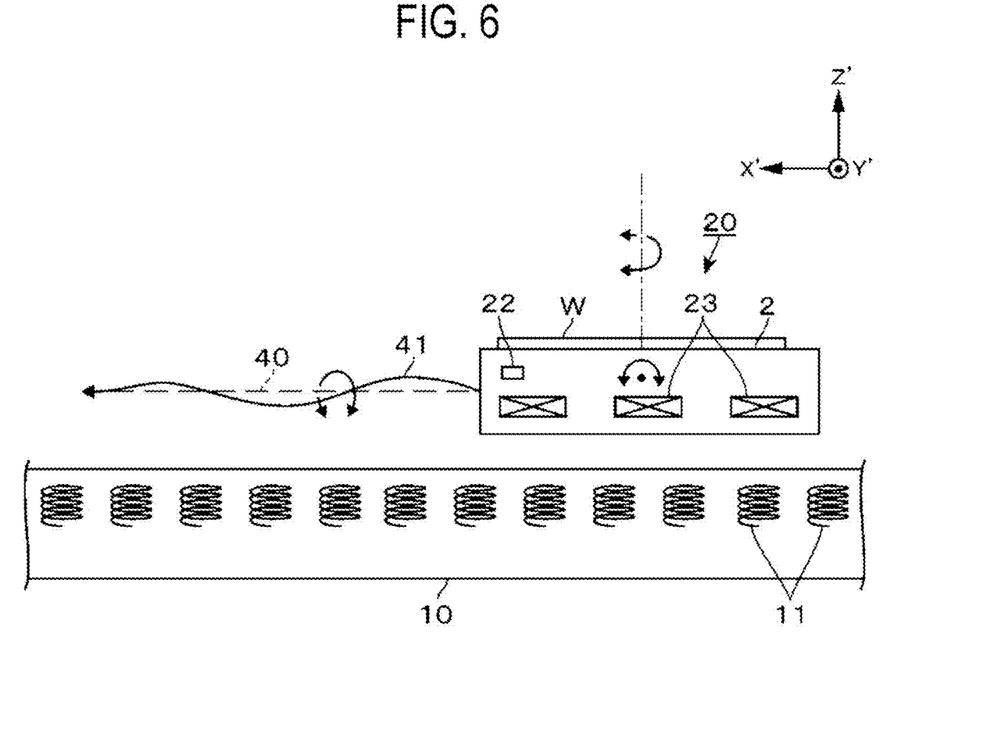
FIG. 6 is a side view of the transfer module during wafer transfer.

The present inventors have found that, when the transfer module 20 is moved along the preset route 40 shown by a broken line in FIGS. 5 and 6, due to the above-mentioned various error factors, the transfer module 20 may actually move vibratingly along a movement route 41 deviated from the preset route 40. In order to increase the moving speed of the transfer module 20, it is preferable to reduce such vibration as much as possible to prevent the transfer module 20 in motion from coming into contact with other transfer modules 20 or devices.

Therefore, the wafer transfer device 101 of the present disclosure is provided with a mechanism that detects the magnitude of the deviation of the actual movement route 41 of the transfer module 20 moving along the movement surface of the tile 10 from the preset route 40 and corrects the deviation.

Regarding the mechanism for correcting the deviation, the transfer module 20 is provided with a known acceleration sensor 22 for detecting an index value corresponding to the magnitude of the force acting on the transfer module 20. The acceleration sensor 22 has a function of detecting the direction of the acceleration of the moving transfer module 20 and the magnitude of the acceleration. The acceleration sensor 22 corresponds to a detector of the present embodiment.

The acceleration sensor 22 of this example is configured to be able to detect the acceleration in each direction of a sub-coordinate system (X'-Y'-Z' cartesian coordinate system shown in FIGS. 2, 3, 5 and 6) set for each transfer module 20.

The detector provided in the transfer module 20 may be constituted with a torque sensor that detects an angular acceleration applied to the transfer module 20. In this case, the magnitude of the acceleration acting in each direction can be specified by decomposing the torque applied to the transfer module 20 in the directions along the sub-coordinate system.

The acceleration detected by the acceleration sensor 22 or the torque sensor increases or decreases depending on the force acting on the moving transfer module 20. Further, as will be described later with reference to FIGS. 7A to 7E, the acceleration of the transfer module 20 facing a predetermined direction is an index value corresponding to the magnitude of the deviation of the actual movement route 41 of the transfer module 20 from the preset route 40.

Information indicating the magnitude of acceleration in each direction detected by the acceleration sensor 22 is output to a communication part 52, for example, by wireless communication (see FIG. 4).

Further, as shown in FIG. 4, the controller 5 is provided with a function of a correction parameter calculation part 502. The correction parameter calculation part 502 has a function of obtaining a correction parameter for correcting the magnetic force acting on the module-side magnet 23 of the transfer module 20 so that the magnitude of the above-mentioned deviation is reduced in the transfer of the wafer W along the preset route 40. The content of the control of the magnetic field by the transfer controller 501 is corrected based on this correction parameter. A specific method of correction will be described in the description of the operation of the wafer processing system 100 (wafer transfer device 101) described later.

An example of an operation of transferring the wafer W with the transfer module 20 and processing the wafer W in the wafer processing chamber 110 will be described with respect to the wafer processing system 100 having the configuration described above.

First, when the carrier C accommodating the wafers W to be processed is placed on the load port 141, the processing recipe set for the wafers W in the carrier C is read out, and the transfer schedule of each wafer W is created. The wafer transfer operation described below is performed based on the transfer schedule.

The wafer W accommodated in the carrier C is taken out by the wafer transfer mechanism 142 in the air transfer chamber 140. Next, the wafer W is transferred to the alignment chamber 150 where alignment is performed on the wafer W. Further, when the wafer W is taken out from the alignment chamber 150 by the wafer transfer mechanism 142, the gate valve 133 of the load lock chamber 130 selected in the transfer schedule is open.

Next, the wafer transfer mechanism 142 enters the load lock chamber 130 in which the gate valve 133 is open, and the wafer W is pushed up and received by the elevating pins 131 provided in the load lock chamber 130. Thereafter, when the wafer transfer mechanism 142 retracts from the load lock chamber 130, the gate valve 133 is closed. Further, the interior of the load lock chamber 130 is switched from the atmospheric pressure atmosphere to the vacuum atmosphere.

After the interior of the load lock chamber 130 becomes a vacuum atmosphere, the gate valve 132 on the vacuum transfer chamber 120 side is open. Thereafter, the transfer module 20 selected in the transfer schedule is magnetically floated and moved from the vacuum transfer chamber 120 into the load lock chamber 130. Next, the transfer module 20 is positioned below the wafer W supported by the elevating pins 131, and the elevating pins 131 are lowered to deliver the wafer W to the transfer module 20. Thereafter, the transfer module 20 holding the wafer W retracts from the load lock chamber 130.

The transfer module 20 that has returned to the vacuum transfer chamber 120 moves in the interior of the vacuum transfer chamber 120 in a magnetically floated state. Then, the transfer module 20 is moved toward the wafer processing chamber 110 selected in the transfer schedule from among the four wafer processing chambers 110. At this time, the transfer module 20 moves along the preset route based on the transfer schedule.

When the transfer module 20 reaches a position facing the selected wafer processing chamber 110, the gate valve 121 of the wafer processing chamber 110 is opened. The transfer module 20 enters the wafer processing chamber 110 in a magnetically floated state and moves to the arrangement area of the elevating pins 112. Then, the elevating pins 112 are raised to push up and receive the wafer W held by the transfer module 20 from the lower side.

The transfer module 20 that has delivered the wafer W is retracted from the wafer processing chamber 110, and then the gate valve 121 is closed. On the other hand, in the wafer processing chamber 110, the elevating pins 112 are lowered to deliver the wafer W to the stage 111. The wafer W placed on the stage 111 is heated by a heater, the processing gas is supplied via the processing gas supplier, and if necessary, the processing gas is plasmarized to execute a predetermined process.

After processing the wafer W for a preset period in this way, the heating of the wafer W is stopped and the supply of the processing gas is stopped. Further, the wafer W may be cooled by supplying a cooling gas into the wafer processing chamber 110 as needed. Thereafter, the transfer module 20 is caused to enter the wafer processing chamber 110 in the reverse procedure to the loading procedure and return the wafer W from the wafer processing chamber 110 to the load lock chamber 130 via the vacuum transfer chamber 120.

Further, after switching the internal atmosphere of the load lock chamber 130 to the atmospheric pressure atmosphere, the wafer W in the load lock chamber 130 is taken out by the wafer transfer mechanism 142 on the air transfer chamber 140 side and returned to a predetermined carrier C.

An example of a method of detecting the magnitude of the deviation of the actual movement route 41 of the transfer module 20 from the preset route 40 and correcting the deviation in the processing of the wafer W described above will be described with reference to FIGS. 5 to 8B.

FIG. 5 is an enlarged plan view of the vacuum transfer chamber 120 provided in the wafer processing system 100 shown in FIG. 1. In the vacuum transfer chamber 120, it is assumed that the preset route 40 indicated by the broken line is set for the transfer module 20 arranged so that the openings of the slits 21 face the load lock chamber 130.

The preset route 40 illustrated in FIG. 5 is set such that the transfer module 20 goes linearly toward the rear side from a position P1 facing the load lock chamber 130 arranged at the center and changes the movement direction to the left side at a position P2 at which the wafer processing chamber 110 (gate valve 121) on the rear stage side is arranged. Thereafter, when the transfer module 20 is moved to a position P3 facing the wafer processing chamber 110 on the left side of the rear stage, the transfer module 20 is rotated clockwise by 90 degrees about the central axis indicated by the one-dot chain line in FIG. 6 and is stopped in a state in which the openings of the slits 21 face the wafer processing chamber 110.

It is assumed that the transfer module 20 actually moves through the movement route 41 indicated by the solid arrow in FIG. 5 rather than the above-mentioned preset route 40 while vibrating left and right with respect to the traveling direction. For the sake of simplification in description, in the transfer module 20, the vertical vibration indicated by the solid arrow in FIG. 6 and the rotational movement of the main body of the transfer module 20 about each of the X', Y' and Z' axes are not considered.

The horizontal axis in FIGS. 7A to 7E indicates respective positions on the preset route 40 extending from the positions P1 to P2 to P3 in FIG. 5. The vertical axis in FIG. 7A indicates a deviation width Δg of the actual movement route 41 in the direction orthogonal to the traveling direction from the preset route 40. Further, the vertical axis in FIG. 7B indicates a velocity vX' in the X' axis direction of the sub-coordinates set for the transfer module 20, and the vertical axis in FIG. 7C indicates an acceleration aX' in the X' axis direction. Further, the vertical axis in FIG. 7D indicates a velocity vY' in the Y' axis direction of the sub-coordinates, and the vertical axis in FIG. 7E indicates an acceleration aY' in the Y' axis direction. It should be noted that these figures do not show the rotational operation of the transfer module 20 at the position P3.

Figure 7A:
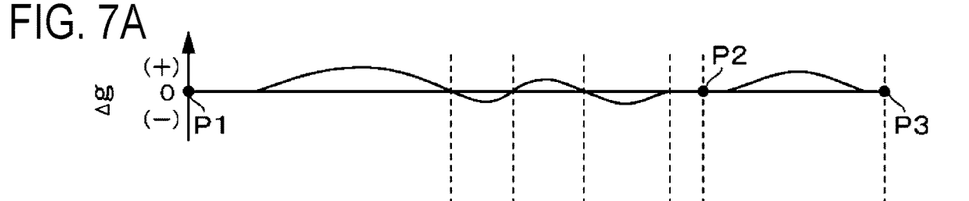
FIGS. 7A to 7E are explanatory diagrams showing a relationship between a deviation of the movement route and a speed and acceleration of the transfer module.
Figure 7B:
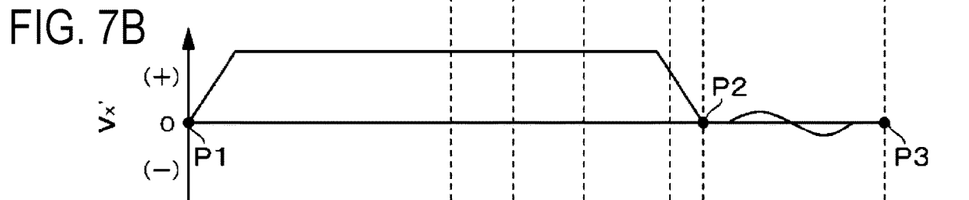
Figure 7C:
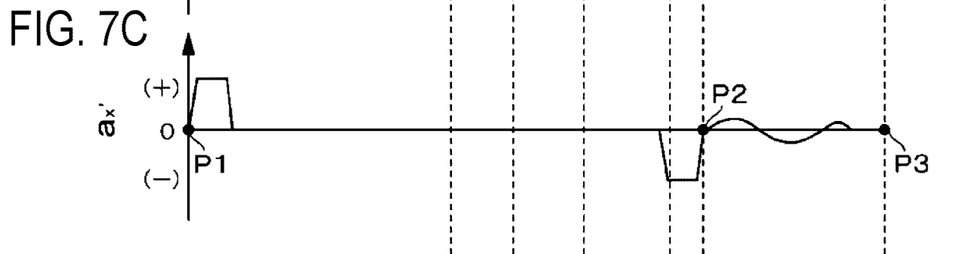

Referring to FIG. 7B, in the movement from the position P1 to the position P2, the transfer module 20 accelerates at a substantially constant acceleration and then moves at a constant velocity in the direction along the traveling direction (X' axis direction). When decelerating, the transfer module 20 decelerates at almost the same degree as when accelerating. As a result, as shown in FIG. 7C, the acceleration sensor 22 provided in the transfer module 20 detects the acceleration acting during acceleration and deceleration of the transfer module 20 in the traveling direction.

Figure 7D:
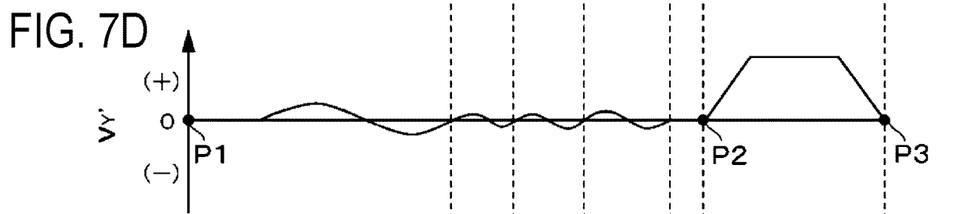

On the other hand, as shown in FIG. 7D, the deviation of the actual movement route 41 from the preset route 40 appears as a speed change of the transfer module 20 in the direction (Y' axis direction) intersecting with the traveling direction. Further, this speed change is detected by the acceleration sensor 22 as a change in acceleration in the direction intersecting with the traveling direction (see FIG. 7E).

Figure 7E:
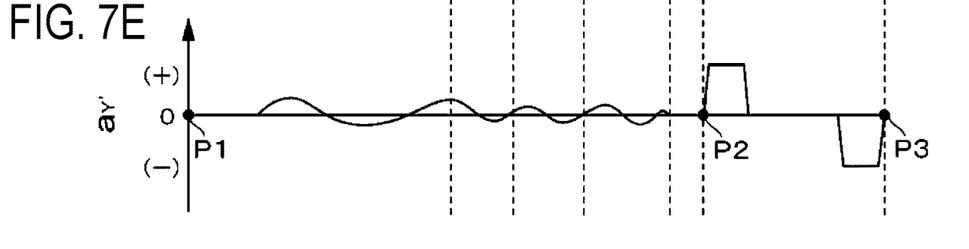

Furthermore, even when moving from the position P2 to the position P3, in the direction along the traveling direction (Y' axis direction), the acceleration sensor 22 detects the acceleration acting during acceleration and deceleration of the transfer module 20 in the traveling direction (see FIG. 7E). Further, the influence of the deviation of the actual movement route 41 is detected by the acceleration sensor 22 as a change in acceleration in the direction (X' axis direction) intersecting with the traveling direction (see FIG. 7C).

As described above, in the linear movement, the deviation of the actual movement route 41 from the preset route 40 can be detected by the acceleration sensor 22 as a change in acceleration in the direction intersecting with the traveling direction. This acceleration is an index value indicating the magnitude of the external force, which is the force acting in the direction intersecting with the direction along the preset route 40. As described above, this external force includes the force generated based on various error factors of the device constituting the tiles 10 and the transfer module 20.

Therefore, the correction parameter calculation part 502 of this example obtains an external force F (=ma) based on the weight m of the transfer module 20 holding the wafer W and the acceleration α in the direction intersecting with the traveling direction. Further, the correction parameter calculation part 502 calculates a correction force having a magnitude corresponding to the external force as a correction parameter and outputs the correction force to the transfer controller 501. The transfer controller 501 performs correction for changing the state of the magnetic field formed by the movement-surface-side coils 11 so that the magnetic force acting on the module-side magnet 23 of the transfer module 20 is increased by the correction force in the direction of canceling the deviation as compared with the magnetic force when the acceleration α is acquired.

Specifically, under the premise that there is no influence of an external force, as compared with the magnetic field formed when the transfer module 20 is moved along the preset route 40, a magnetic field that increases the magnetic force acting on the module-side magnet 23 by the amount of the correction force in the deviation canceling direction is formed at each position of the movement route 41. The magnetic field is adjusted by adjusting the various operation variables described above (the selection of the movement-surface-side coil 11 to be supplied with electric power, the power supply amount, the switching of power supply direction, and the like).

Figure 8A:
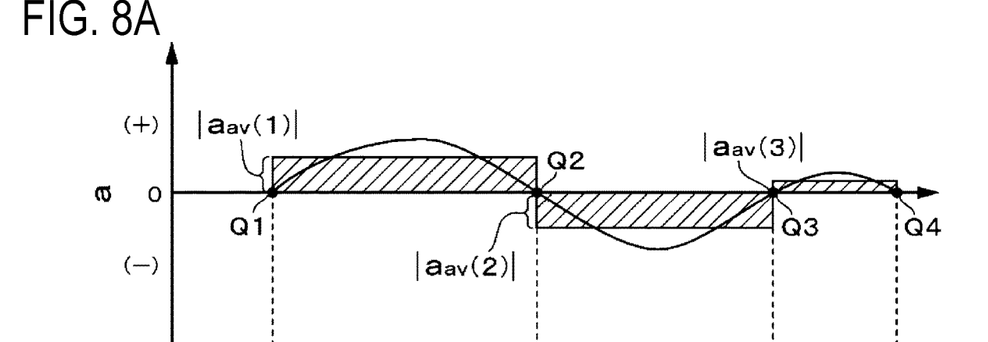
FIGS. 8A and 8B are explanatory diagrams showing an example of a correction parameter calculation method.
Figure 8B:
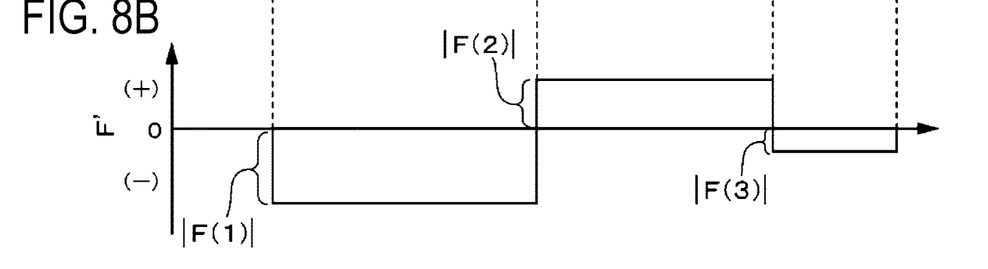

FIGS. 8A and 8B show an example of a method for calculating correction parameters. The horizontal axis in FIGS. 8A and 8B indicates each position in the preset route 40 of the transfer module 20. Further, the vertical axis in FIG. 8A indicates the acceleration α acting in the direction intersecting with the traveling direction of the preset route 40, and FIG. 8B indicates the correction force F'.

In the example of FIG. 8A, positions Q1 to Q4 where the direction of the acceleration a (direction of the external force) changes are specified, and average accelerations $a_{av}(1)$ to $a_{av}(3)$ during the period of passing through these positions are obtained. Then, the correction force F' (=$ma_{av}$) acting in the deviation canceling direction is calculated from these average accelerations $a_{av}$s and the weight m of the transfer module 20. In addition, the average values of the acceleration α may be obtained at position intervals or time intervals shorter than those of the example shown in FIGS. 8A and 8B to improve the resolution of the correction force F'.

The calculation of the correction parameter (correction force) described above and the correction for changing the state of the magnetic field formed by the movement-surface-side coil 11 can be applied to the deviations other than the X'-axis and Y'-axis direction deviations of the sub-coordinates described with reference to FIGS. 5 and 7A to 7E.

For example, even for the deviation of the movement route 41 in the Z'-axis direction shown in FIG. 6, the correction parameter can be calculated based on the change in the acceleration in the Z'-axis direction intersecting with the traveling direction of the transfer module 20.

Further, it is possible to calculate the correction parameter for the change in the moving velocity along the traveling direction of the transfer module 20 as in the longitudinal wave. For example, the difference value Δa between the change in acceleration when accelerating and decelerating along the preset route 40 and the change in acceleration detected in the actual movement route 41 is obtained. Then, the correction force F' (=mΔa) is calculated from the difference value Δa and the weight m of the transfer module 20.

Further, the above-mentioned method can be applied to the correction of a deviation not only in the case of linearly moving the transfer module 20 but also in the case of curvedly moving the transfer module 20. In this case, at each position of the curved preset route 40, a change in acceleration acting in the normal direction orthogonal to the tangential direction of the curve is detected. However, in the case of a curved movement, the acceleration acting in the normal direction is also detected for the transfer module 20 that moves along the preset route 40.

Therefore, at each position of the preset route 40, the difference value $\Delta a$ between the acceleration detected by the acceleration sensor 22 and the acceleration assumed to be detected when the transfer module 20 moves along the preset route 40 is obtained. Then, the correction force F' (=m$\Delta a$) is calculated from the difference value $\Delta a$ and the weight m of the transfer module 20.

Further, as for the rotation operation of the transfer module 20 around each sub-coordinate shown in FIG. 6, the magnitude of the deviation of the actual movement route 41 of the transfer module 20 related to the rotation operation from the preset route 40 can be detected, and the deviation can be corrected. An example of the preset route 40 may include a rotation trajectory R of 90 degrees around the position P3 in FIG. 5. In this case, for example, a plurality of acceleration sensors 22 is provided at different positions on the tile 10 so that the position of the rotation axis of the transfer module 20 and the angular velocity around the rotation axis can be obtained from the magnitude and direction of the acceleration detected by each acceleration sensor 22.

Then, the angular acceleration in the direction intersecting with the preset route 40 (in the case of the rotation trajectory R, the angular acceleration related to the rotational motion about the X' axis and the Y' axis orthogonal to the Z' axis) is detected as an index value by the plurality of acceleration sensors 22. Then, the correction parameter calculation part 502 can calculate a magnitude N (=I$\alpha$) of a correction moment force N for correcting the deviation, based on the angular acceleration $\alpha$ in the intersecting direction and a moment of inertia I determined from the shape of the transfer module 20, the density distribution of the constituent members and the position of the rotation axis.

The transfer controller 501 performs correction for changing the state of the magnetic field formed by the movement-surface-side coils 11 so that the magnetic force acting on the module-side magnet 23 is increased by the correction moment force in the direction of canceling the deviation as compared with the magnetic force when the angular acceleration $\alpha$ is acquired.

Next, an example of the timing at which the above correction is performed will be described. First, there may be illustrated a case where a test run period for executing only the movement operation of the transfer module 20 along the preset route 40 is executed before starting the processing of the wafer W in the wafer processing chamber 110. During the test run period, the transfer module 20 may be moved while actually transferring the wafer W along the preset route 40.

In this case, the acceleration sensor 22 detects the index value (acceleration or angular acceleration) for the movement operation of the transfer module 20 during the test run period. The correction parameter calculation part 502 calculates the correction parameter by the above-described method based on the index value detected during the test run period.

Then, the transfer controller 501 terminates the test run period based on the calculated correction parameter and performs correction for changing the state of the magnetic field so that the above-mentioned deviation is corrected during the processing period, which is the period in which the wafer W is processed in the wafer processing chamber 110.

Secondly, there may be illustrated a case where during the processing period in which the wafer W is processed in the wafer processing chamber 110, the index value is detected by the acceleration sensor 22 in one movement operation of moving the transfer module 20 along the preset route 40. The correction parameter calculation part 502 calculates the correction parameter by the above-described method based on the index value detected in the one movement operation. At this time, index values may be detected by a plurality of movement operations, and an average value of the index values may be adopted as the index value of the one movement operation.

Based on the calculated correction parameter, the correction parameter calculation part 502 performs correction for changing the state of the magnetic field to correct the above-mentioned deviation by another movement operation of moving the transfer module 20 along the same preset route 40 after the above-mentioned one movement operation.

According to the wafer transfer device 101 of the present embodiment, the transfer module 20 can be moved more accurately along the preset route. As a result, it is possible to avoid contact with other transfer modules 20 and devices when the transfer module 20 is moved at a high speed.

The present disclosure is not limited to the case where the magnitude of the acceleration at which the transfer module 20 moves in the direction intersecting with the direction along the preset route 40 is detected as the index value corresponding to the magnitude of the force acting on the transfer module 20.

For example, a deviation width of the actual movement route 41 from the preset route 40 may be detected and used as an index value. In this case, a camera for capturing the position of the transfer module 20 on the movement surface, or a hall sensor for detecting the position of the transfer module 20 from the tile 10 side may be adopted as the sensor constituting the detector. Further, the detector may be constituted with a laser displacement meter that detects the position of the transfer module 20 based on the distance from the irradiation position of the laser beam. By detecting the position of the transfer module 20, it is possible to specify the actual movement route 41 and obtain the deviation width from the preset route 40.

At this time, the transfer controller 501 obtains an acceleration, which is a second-order time derivative value for the detected time-dependent change of the deviation width. Further, the transfer controller 501 calculates a correction force having a magnitude corresponding to the external force acting on the transfer module 20 in the intersecting direction based on the acceleration, and uses the correction force as a correction parameter. Then, the correction parameter calculation part 502 performs the above-mentioned correction so that the magnetic force acting on the module-side magnet 23 is increased by the correction force in the direction of canceling the deviation as compared with the magnetic force when the deviation width is acquired.

Here, the transfer module 20 may also be configured so that it can be moved in a floated state by changing the distance from the movement surface of the tile 10. In this case, the detection of the various index values described above may be performed a plurality of times by changing the distance from the movement surface of the transfer module 20.

The correction parameter calculation part 502 can estimate the index value at the preset distance from the movement surface by interpolation or extrapolation based on the change of the index value detected under the conditions of different distances from the movement surface. Based on this estimation result, the correction parameter calculation part 502 can calculate the correction parameter corresponding to the preset distance from the movement surface.

The transfer module 20 may be configured to transfer, in addition to the wafer W described above, transfer target objects having weights different from that of the wafer W, such as replacement parts in the wafer processing chamber 110, and the like. In this case, the detection of the various index values described above may be performed a plurality of times by changing the load applied to the transfer module 20.

The correction parameter calculation part 502 can estimate, by interpolation or extrapolation, the index value in the weight of the transfer target object transferred by the transfer module 20, based on the change of the index value detected under these different load conditions. Based on this estimation result, the correction parameter calculation part 502 can calculate the correction parameter corresponding to the weight of the transfer target object transferred by the transfer module 20.

In the embodiment described with reference to FIGS. 1 to 6, there has been described the configuration example in which the tiles 10 are arranged on the floor surfaces of the load lock chamber 130, the vacuum transfer chamber 120 and the wafer processing chamber 110 and in which the transfer module 20 is magnetically floated on the horizontal movement surface. However, the movement surface is not limited to the horizontal surface and may be an inclined surface or a vertical surface. Even in this case, the acceleration sensor 22 of the transfer module 20 can be affected by the magnetic force, which is at least one of a repulsive force and an attractive force acting between the acceleration sensor 22 and the magnetic field of the movement-surface-side coil 11 on the tile 10 side, and can be moved while being floated from the movement surface.

As for the transfer module 20 that moves on the inclined surface or the vertical surface, it is possible to perform detection of index values such as an acceleration of the transfer module 20 and a deviation width from the preset route 40 by the detector, calculation of correction parameters by the correction parameter calculation part 502, and correction for changing the state of the magnetic field formed by the movement-surface-side coil 11 based on the correction parameter obtained by the transfer controller 501.

Figure 2:
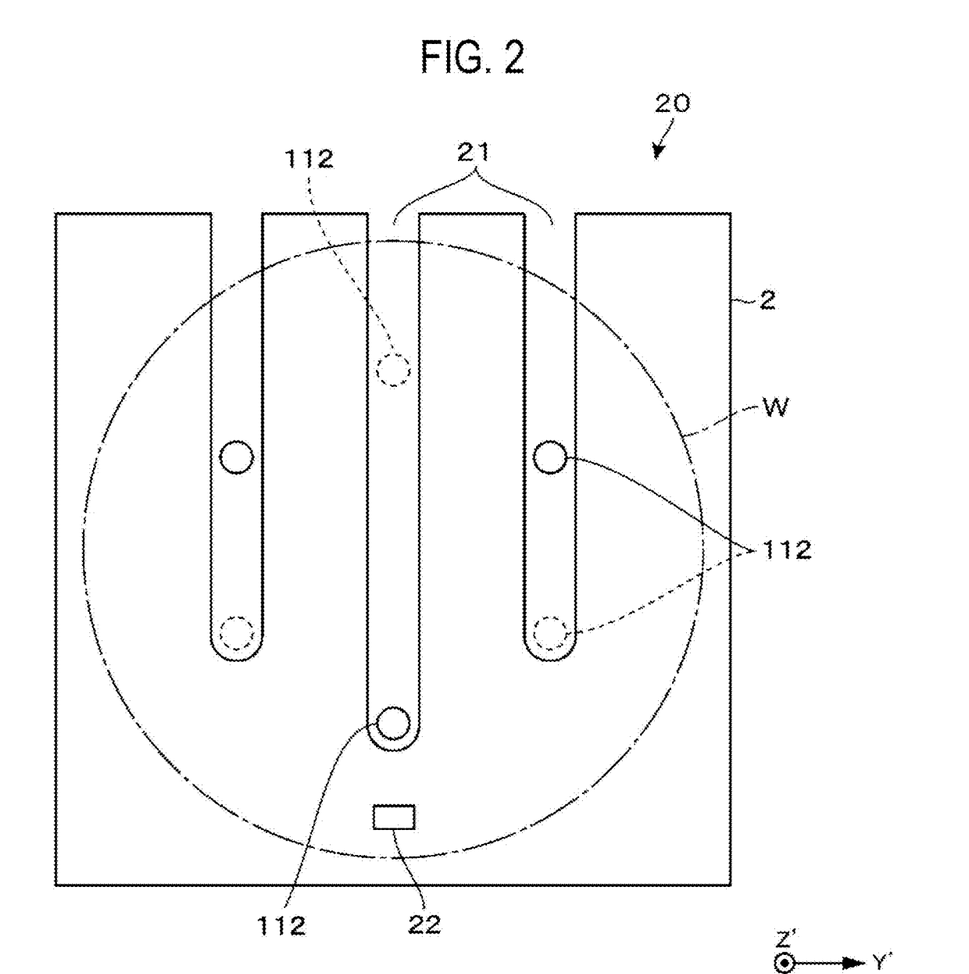
FIG. 2 is a plan view of a transfer module.

Furthermore, the configuration of the transfer module 20 to which the technique of the present disclosure can be applied is not limited to those shown in FIGS. 2, 3 and the like. For example, the transfer module 20 having a disk-shaped external shape may be used instead of the transfer module having the square plate-shaped external shape.

In addition, it may be possible to adopt a configuration in which a fork is provided to extend laterally from the main body of the square plate-shaped or disk-shaped transfer module 20 provided with the module-side magnet 23, and the wafer W is held on the fork. In this case, even if the tiles 10 are not provided in the wafer processing chamber 110 or the load lock chamber 130, the fork can be inserted to deliver the wafer W.

According to the present disclosure in some embodiments, it is possible to move a substrate transfer module more accurately along a preset route.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A device for transferring a substrate with respect to a substrate processing chamber in which a substrate is processed, comprising:
   a movement tile provided in a substrate transfer region extending from a substrate delivery position communicating with an outside to a substrate processing position inside the substrate processing chamber, the movement tile including a plurality of first magnets configured to change a state of a magnetic field and a movement surface;
   a substrate transfer module configured to hold the substrate and including a second magnet configured to receive an action of a magnetic force which is at least one of a repulsive force and an attractive force acting between the magnetic field of the plurality of first magnets and a magnetic field of the second magnet, the substrate transfer module configured to move along the movement surface in a state of being floated from the movement surface by the magnetic force;
   a transfer controller configured to control the magnetic field formed by the plurality of first magnets so that the substrate transfer module is moved along a preset route;
   a detector configured to detect an index value corresponding to a magnitude of a deviation, from the preset route, of an actual movement route of the substrate transfer module moving along the movement surface as the magnetic field is controlled by the transfer controller; and
   a correction parameter calculation part configured to calculate a correction parameter for correcting the magnetic force acting on the second magnet based on the index value so that the magnitude of the deviation is reduced,
   wherein the transfer controller is configured to perform a correction to change the state of the magnetic field based on the correction parameter in a subsequent transfer of a substrate along the preset route,
   wherein the detector includes a sensor configured to detect an acceleration of the substrate transfer module, and the index value is a magnitude of the acceleration at which the substrate transfer module is moved in a direction intersecting with a direction extending along the preset route,
   wherein the correction parameter calculation part is configured to calculate a correction force having a magnitude corresponding to an external force acting on the transfer module in the direction intersecting with the direction extending along the preset route based on the acceleration as the correction parameter, and
   wherein the transfer controller is configured to perform the correction so that the magnetic force acting on the second magnet is increased by the correction force in a direction of canceling the deviation as compared with the magnetic force when the index value is detected.

2. The device of claim 1, wherein the detection of the index value by the detector is executed during a test run period in which the substrate transfer module is moved along the preset route before starting the processing of the substrate in the substrate processing chamber, and
   wherein the transfer controller is configured to perform, based on the correction parameter, the correction to change the state of the magnetic field during a processing period in which the substrate is processed in the substrate processing chamber after the test run period.

3. The device of claim 2, wherein the substrate transfer module is configured to change a distance from the movement surface when moving in the floated state,
   wherein the detection of the index value is executed a plurality of times by changing the distance of the substrate transfer module from the movement surface, and
   wherein the correction parameter calculation part is configured to calculate the correction parameter corresponding to the preset distance from the movement surface based on an index value detected under a condition of different distances from the movement surface.

4. The device of claim 3, wherein the substrate transfer module is configured to transfer a transfer target object having a weight different from a weight of the substrate,
   wherein the detection of the index value is executed a plurality of times by changing a load applied to the substrate transfer module, and
   the correction parameter calculation part is configured to calculate the correction parameter corresponding to the weight of the transfer target object transferred by the substrate transfer module, based on index values detected under a condition of different loads.

5. A method of transferring a substrate with respect to a substrate processing chamber in which a substrate is processed, the method comprising:
   moving a transfer controller along a preset route by controlling a magnetic field formed by a plurality of first magnets using: a movement tile including the plurality of first magnets configured to change a state of the magnetic field and a movement surface, and provided in a substrate transfer region extending from a substrate delivery position communicating with an outside to a substrate processing position inside the substrate processing chamber; and a substrate transfer module configured to hold the substrate and including a second magnet configured to receive an action of a magnetic force which is at least one of a repulsive force and an attractive force acting between the magnetic field of the plurality of first magnets and a magnetic field of the second magnet, and configured to move along the movement surface in a state of being floated from the movement surface by the magnetic force;
   detecting an index value corresponding to a magnitude of a deviation, from the preset route, of an actual movement route of the substrate transfer module moving along the movement surface by controlling the magnetic field;
   calculating a correction parameter for correcting the magnetic force acting on the second magnet based on the index value so that the magnitude of the deviation is reduced; and
   performing a correction to change the state of the magnetic field based on the correction parameter in the transfer of the substrate along the preset route after the using the substrate transfer module,
   wherein in the detecting the index value, a magnitude of an acceleration at which the substrate transfer module is moved in a direction intersecting with a direction extending along the preset route is detected as the index value by using a sensor configured to detect the acceleration of the substrate transfer module,
   wherein in the calculating the correction parameter, a correction force having a magnitude corresponding to an external force acting on the transfer module in the direction intersecting with the direction extending along the preset route is calculated as the correction parameter based on the acceleration, and
   wherein, in the performing the correction, the correction is performed so that the magnetic force acting on the second magnet is increased by the correction force in a direction of canceling the deviation as compared with the magnetic force when the index value is detected.

6. The method of claim 5, wherein the detecting the index value is executed during a test run period in which the substrate transfer module is moved along the preset route before starting the processing of the substrate in the substrate processing chamber, and
   wherein the performing the correction is executed to change the state of the magnetic field during a processing period in which the substrate is processed in the substrate processing chamber after the test run period.

7. The method of claim 6, wherein the substrate transfer module is configured to change the distance from the movement surface when moving in the floated state,
   wherein the detecting the index value is executed a plurality of times by changing the distance of the substrate transfer module from the movement surface, and
   wherein the calculating the correction parameter is executed to calculate the correction parameter corresponding to the preset distance from the movement surface based on an index value detected under a condition of different distances from the movement surface.

8. The method of claim 7, wherein the substrate transfer module is configured to transfer a transfer target object having a weight different from a weight of the substrate,
   wherein the detecting the index value is executed a plurality of times by changing a load applied to the substrate transfer module, and
   wherein the calculating the correction parameter is executed to calculate the correction parameter corresponding to the weight of the transfer target object transferred by the substrate transfer module, based on index values detected under a condition of different loads.

9. A device for transferring a substrate with respect to a substrate processing chamber in which a substrate is processed, comprising:
   a movement tile provided in a substrate transfer region extending from a substrate delivery position communicating with an outside to a substrate processing position inside the substrate processing chamber, the movement tile including a plurality of first magnets configured to change a state of a magnetic field and a movement surface;
   a substrate transfer module configured to hold the substrate and including a second magnet configured to receive an action of a magnetic force which is at least one of a repulsive force and an attractive force acting between the magnetic field of the plurality of first magnets and a magnetic field of the second magnet, the substrate transfer module configured to move along the movement surface in a state of being floated from the movement surface by the magnetic force;
   a transfer controller configured to control the magnetic field formed by the plurality of first magnets so that the substrate transfer module is moved along a preset route;

a detector configured to detect an index value corresponding to a magnitude of a deviation, from the preset route, of an actual movement route of the substrate transfer module moving along the movement surface as the magnetic field is controlled by the transfer controller; and a correction parameter calculation part configured to calculate a correction parameter for correcting the magnetic force acting on the second magnet based on the index value so that the magnitude of the deviation is reduced, wherein the transfer controller is configured to perform a correction to change the state of the magnetic field based on the correction parameter in a subsequent transfer of a substrate along the preset route, wherein the detector includes a sensor configured to detect a position of the substrate transfer module on the movement surface, and the index value is a deviation width of the movement route from the preset route, wherein the correction parameter calculation part is configured to calculate a correction force having a magnitude corresponding to an external force acting on the transfer module in a direction intersecting with a direction extending along the preset route based on an acceleration which is a second-order time derivative value for the deviation width as the correction parameter, and wherein the transfer controller is configured to perform the correction so that the magnetic force acting on the second magnet is increased by the correction force in the direction of canceling the deviation as compared with the magnetic force when the index value is acquired.

10. The device of claim 9, wherein the detection of the index value by the detector is executed by a first movement operation of moving the substrate transfer module along the preset route during a processing period in which the substrate is processed in the substrate processing chamber, and wherein the transfer controller is configured to perform, based on the correction parameter, the correction to change the state of the magnetic field in a second movement operation of moving the substrate transfer module along the preset route after the first movement operation.

11. A method of transferring a substrate with respect to a substrate processing chamber in which a substrate is processed, the method comprising:

moving a transfer controller along a preset route by controlling a magnetic field formed by a plurality of first magnets using: a movement tile including the plurality of first magnets configured to change a state of the magnetic field and a movement surface, and provided in a substrate transfer region extending from a substrate delivery position communicating with an outside to a substrate processing position inside the substrate processing chamber; and a substrate transfer module configured to hold the substrate and including a second magnet configured to receive an action of a magnetic force which is at least one of a repulsive force and an attractive force acting between the magnetic field of the plurality of first magnets and a magnetic field of the second magnet, and configured to move along the movement surface in a state of being floated from the movement surface by the magnetic force;

detecting an index value corresponding to a magnitude of a deviation, from the preset route, of an actual movement route of the substrate transfer module moving along the movement surface by controlling the magnetic field;

calculating a correction parameter for correcting the magnetic force acting on the second magnet based on the index value so that the magnitude of the deviation is reduced; and performing a correction to change the state of the magnetic field based on the correction parameter in the transfer of the substrate along the preset route after the using the substrate transfer module, wherein in the detecting the index value, a deviation width of the movement route from the preset route is detected as the index value by using a sensor configured to detect a position of the substrate transfer module on the movement surface, wherein in the calculating the correction parameter, a correction force having a magnitude corresponding to an external force acting on the transfer module in a direction intersecting with a direction extending along the preset route is calculated as the correction parameter based on an acceleration which is a second-order time derivative value for the deviation width, and wherein, in the performing the correction, the correction is performed so that the magnetic force acting on the second magnet is increased by the correction force in a direction of canceling the deviation as compared with the magnetic force when the index value is detected.

12. The method of claim 11, wherein the detecting the index value is executed in a first movement operation of moving the substrate transfer module along the preset route during a processing period in which the substrate is processed in the substrate processing chamber, and wherein the performing the correction is executed to change the state of the magnetic field in a second movement operation of moving the substrate transfer module along the preset route after the first movement operation.

* * * * *